United States Patent [19]
Tan et al.

[11] Patent Number: 6,043,481
[45] Date of Patent: *Mar. 28, 2000

[54] OPTOELECTRONIC ARRAY DEVICE HAVING A LIGHT TRANSMISSIVE SPACER LAYER WITH A RIDGED PATTERN AND METHOD OF MAKING SAME

[75] Inventors: Tun Sein Tan, Cupertrino; Ronald Kaneshiro, Mountain View, both of Calif.

[73] Assignee: Hewlett-Packard Company, Palo Alto, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/846,730

[22] Filed: Apr. 30, 1997

[51] Int. Cl.[7] .................................................. H01J 3/14

[52] U.S. Cl. .......................... 250/216; 250/214.1; 257/82

[58] Field of Search ............................ 250/216, 214.1, 250/239, 214 R, 208.1; 257/82, 80–84, 79, 431–435

[56] References Cited

U.S. PATENT DOCUMENTS

| | | | |
|---|---|---|---|
| 4,689,291 | 8/1987 | Popovic et al. | 430/321 |
| 4,694,185 | 9/1987 | Weiss | 250/208.1 |
| 5,210,400 | 5/1993 | Usami | 250/216 |
| 5,298,366 | 3/1994 | Iwasaki et al. | 430/321 |
| 5,317,149 | 5/1994 | Uebbing et al. | 250/216 |
| 5,324,623 | 6/1994 | Tsumori | 430/321 |
| 5,466,926 | 11/1995 | Sasano et al. | 250/216 |
| 5,482,800 | 1/1996 | Gal | 430/5 |

*Primary Examiner*—Que T. Le
*Attorney, Agent, or Firm*—Deborah A. Neville

[57] ABSTRACT

An optoelectronic device and method for making same in which the device demonstrates efficient fill factor and focuses light upon an optoelectronic element close to the focal point of the light focusing element. The device comprises a substrate supporting an optoelectronic element, a microlens array, and a light transmissive layer intermediate between the substrate and the microlens array. The intermediate layer is of a thickness so that the spot size formed by the light collected by the microlens is substantially smaller than the photosensitive or photosensitive area at the plane of the optoelectronic element. In alternate embodiments, the transmissive layer assists in achieving maximum fill factor. The method taught provides minimum alignment steps thereby providing a method of improved manufacturability.

10 Claims, 9 Drawing Sheets

PHOTORECEIVER

PHOTOEMITTER

MICROLENS ARRAY

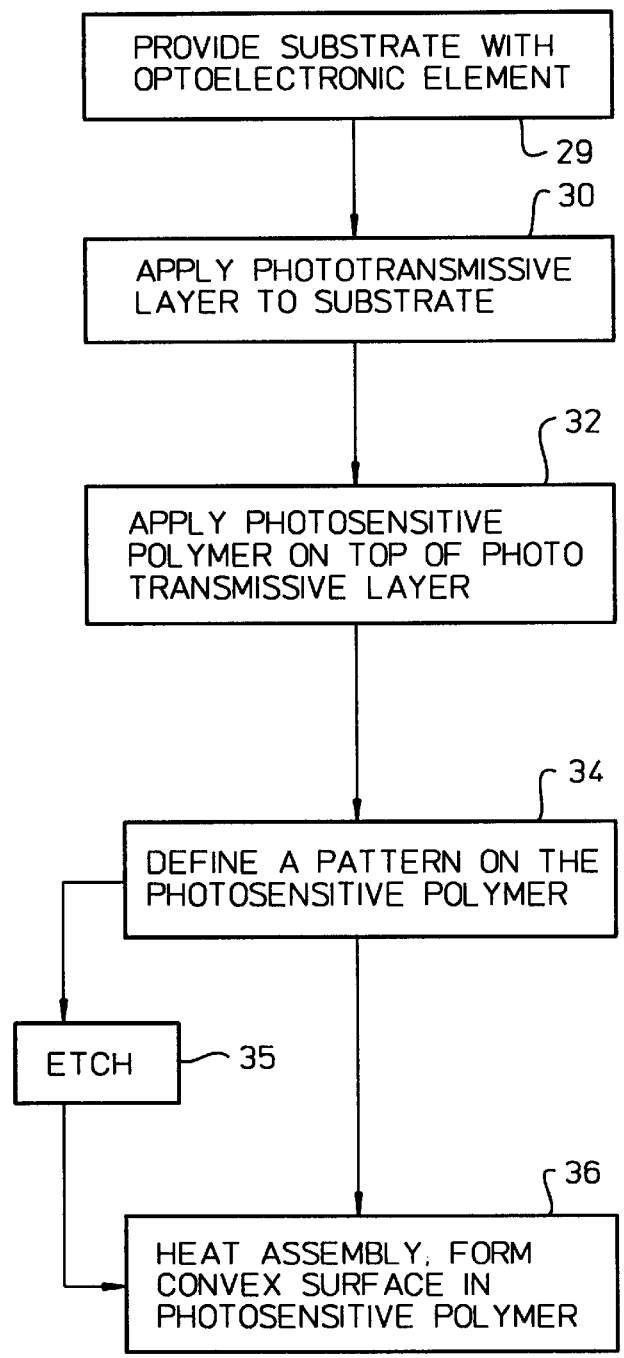 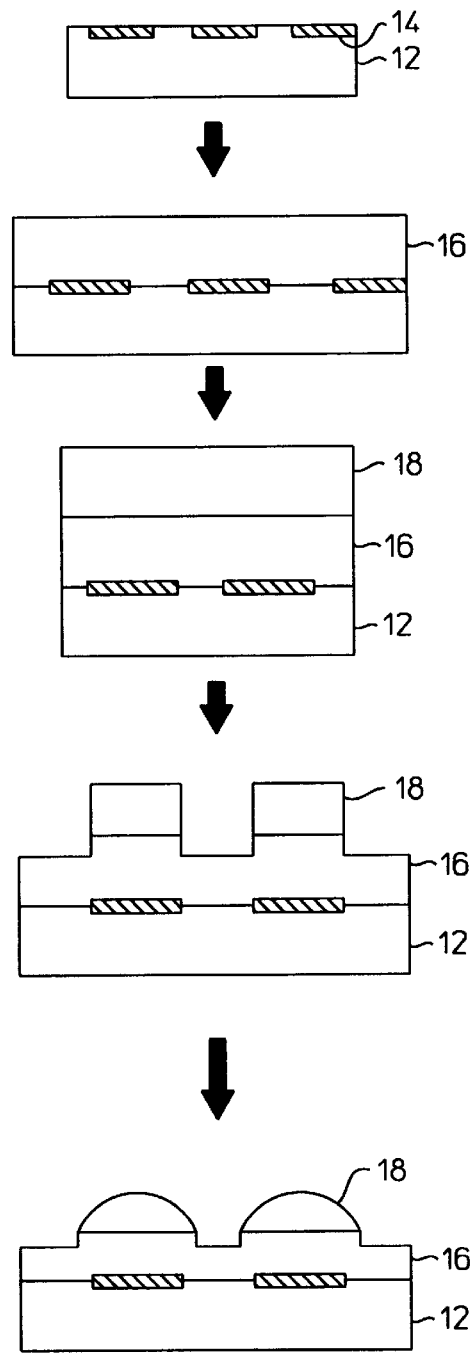
Figure 8A
Figure 8B

OPTOELECTRONIC ARRAY DEVICE HAVING A LIGHT TRANSMISSIVE SPACER LAYER WITH A RIDGED PATTERN AND METHOD OF MAKING SAME

BACKGROUND OF THE INVENTION

The invention relates to an optoelectronic device and a method for forming an optoelectronic device which may include a photoreceptive array, a photoemissive array, or both. Further, the invention teaches a receptive device and method for forming a receptive device wherein a microlens array exhibits maximum fill factor, good uniform spot-size and intensity, optimum distance from photoreceptive elements and good lens quality. The invention also teaches an emissive device and a method for forming an emissive device wherein the microlens array can satisfy the conditions for collimating, focusing or directing emission from photoemittive elements to specific target.

The optoelectronic array in an imaging integrated circuit (IC) chip is one of the crucial components in defining the sensitivity and resolution of electronic imaging devices such as digital cameras, scanners and printers. Due to complex signal processing requirements associated with each pixel of the optoelectronic or photo sensor array, a significant area surrounding the pixel is covered with metal and signal processing elements which do not convert the impinging light into an electronic signal. The condition wherein light is not optimally focused on photoreceptive elements contributes to a degraded image quality and impairs other performance characteristics. The loss of light to non-converting surface area contributes to loss of fill factor. Fill factor may be improved by coupling a tightly spaced microlens array with the optoelectronic array. To achieve maximum fill factor, the spacing between the microlens elements must be minimized and the spatial relationship between the microlens array and the optoelectronic array should be such that all the light collected by the microlens forms a spot-size which is substantially smaller than the photosensitive area of the photo sensor element at the plane of the optoelectronic array. This enables complete coverage even with less than perfect alignment between lens and optoelectronic array elements.

Some known lens array methods rely on multiple application and removal steps, including application and subsequent removal of an opaque metallic layer (see Popovic et al, U.S. Pat. No. 4,689,291). A common lens array element spacing technique involves etching through a pedestal layer creating a barrier space between microlens elements, then, after applying photo resist (which will serve as a lens element), etching through the photo resist layer. The method is not without several serious drawbacks. Perhaps most limiting is that this method and those similar to it are limited in the closeness of the spacing. This limitation is owing to the tendency of the individual lens elements to fuse together across the barrier space. Secondly, in a method calling for multiple alignment steps, each alignment step adds loss of precision. Loss of precision impairs the manufacturability, making it difficult to repeatably produce a device in which the microlens focuses a spot-size substantially smaller than the photosensitive area at the plane of the optoelectronic array. The closer the spacing of the microlens array, the more crucial alignment becomes, and with more than one alignment step, the possibility increases of misalignment of microlens elements and optoelectronic elements. Such misalignment will result in loss of signal and degraded resolution. What is needed is a method for making optoelectronic devices in which the method has a minimum number of alignment steps and the devices so made have maximum fill factor.

In other applications such as optical interconnects, optoelectronic devices can be useful in collimating, directing and focusing the light emitted from an array of photo emitters onto specific target elements. A method providing control over optical capture and transmission is desired and much sought after, especially where such method provides for the creation of devices exhibiting any of the following: maximum fill factor, uniform spot-size, uniform spot intensity, good lens quality, optimum spacing between the microlens array and the optoelectronic element plane.

Many optical devices require collection and transmission of light. Scanners, digital cameras, and printers all require full capture of light to support output resolution. Any loss of light results in degradation of performance. In other applications such as optical interconnects, control over microarray density and placement directly translates to control over directing light to specific target elements. Thus control over optical capture and transmission is a much sought after device feature.

SUMMARY OF THE INVENTION

The invention provides a device for collecting, transmitting and detecting light such that light collection is maximized, and light loss minimized. The invention further provides, in one embodiment, a device wherein transmitted light is detected by photosensitive elements positioned, through the interposition of a light transmissive layer member, close to ("close to" is intended herein and throughout should be understood to include "at") the focal distance of the collecting lens element. In one embodiment, a device containing a microlens array in which the lens elements are closely packed is assembled so as to optically associate the lens elements with a substrate containing optoelectronic elements; through the presence of an optically transmissive intermediate layer (intermediate layer), the focal distance of the lens elements are accommodated so that the amount of light falling on the optoelectronic elements is optimized.

Moreover, the invention provides for a contoured surface on the intermediate layer. The contoured surface provides lateral guides for microlens spacing. The lateral spacing guides facilitate maximum packing of lens elements, such optimized packing is commonly referred to as "maximum fill factor".

The invention includes the method of assembling the inventive optoelectronic devices wherein the assembled device has at least one optically transmissive intermediate or spacer layer.

One embodiment includes layering transmissive polymer or dielectric material, such as $SiO_2$ or glass, upon a substrate containing optoelectronic elements. The optoelectronic elements may include photosensitive receptors, or emitters, or both. Application of a photosensitive polymer to the substrate and photolithographic patterning of the photosensitive polymer imposes a pattern on the photosensitive polymer. After heating, the patterned photosensitive polymer exhibits convex surface, each convex surface providing lens function, and may be called a microlens. Light transmitted by or through the convex surfaced photosensitive polymer (microlenses) passes through the transmissive intermediate layer or spacer layer of polymer or dielectric material. The intermediate layer or spacer layer is of a predetermined thickness such that the focal length of the convex surfaces or micro lenses is close to the position of the optoelectronic elements. In configurations where the optoelectronic element is an emitter, the relationship between the lens element and the emissive element is such that light leaving the lens element is collimated.

BRIEF DESCRIPTION OF THE DRAWINGS

FIG. 8 illustrates a version of the inventive method.

DETAILED DESCRIPTION OF THE PREFERRED EMBODIMENTS

Figure 1:
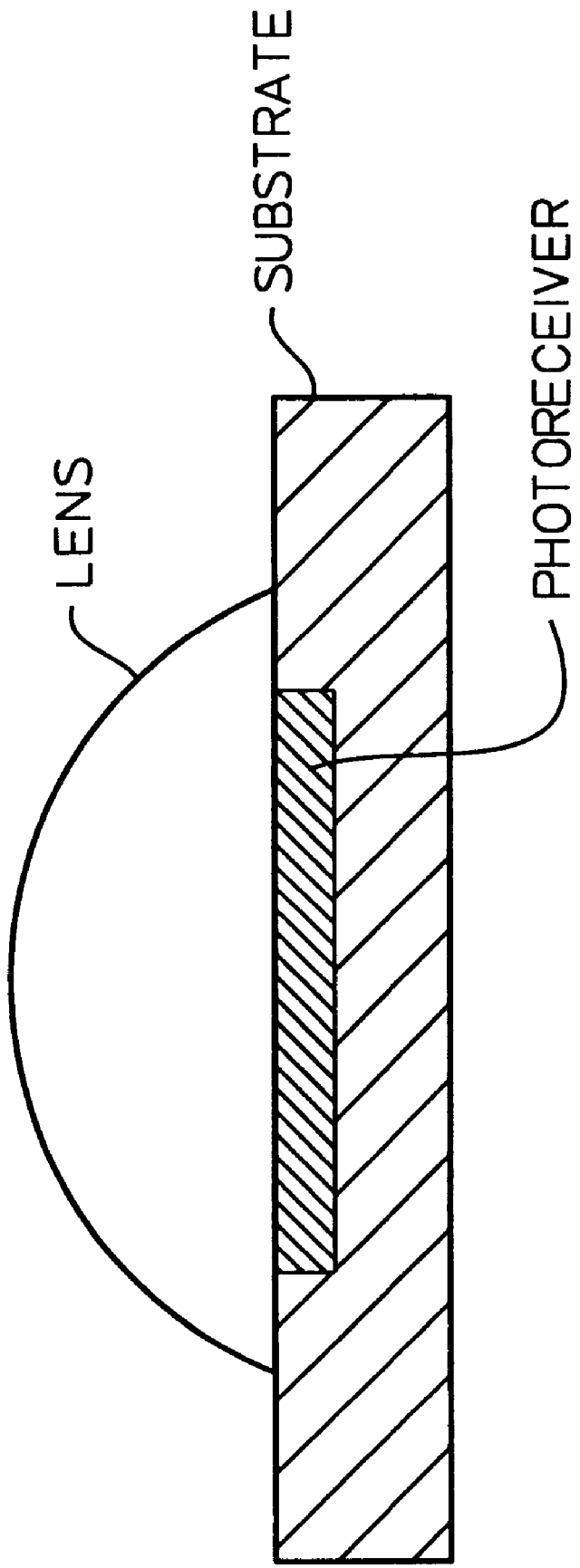
FIG. 1 illustrates the prior art.
Figure 2A:
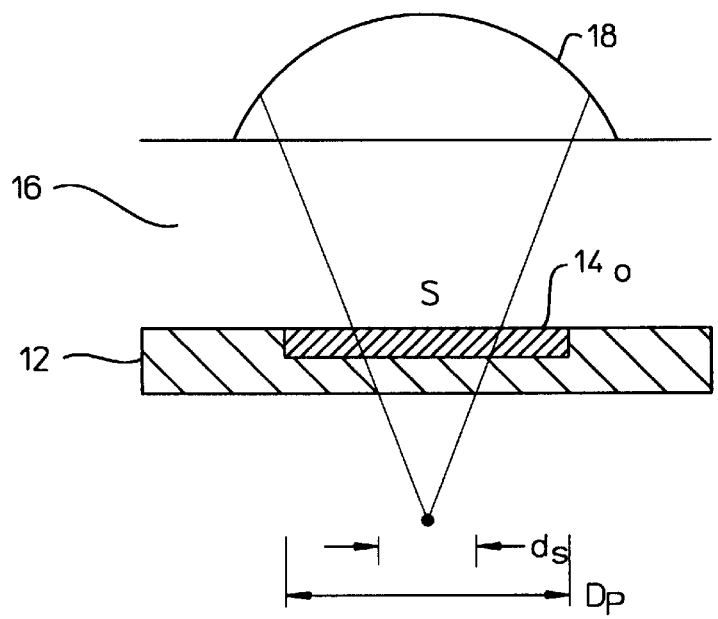
FIG. 2A illustrates a cross section of an assembly in accordance with one embodiment of the invention demonstrating spot-size smaller than the diameter of the photosensitive element.
Figure 2B:
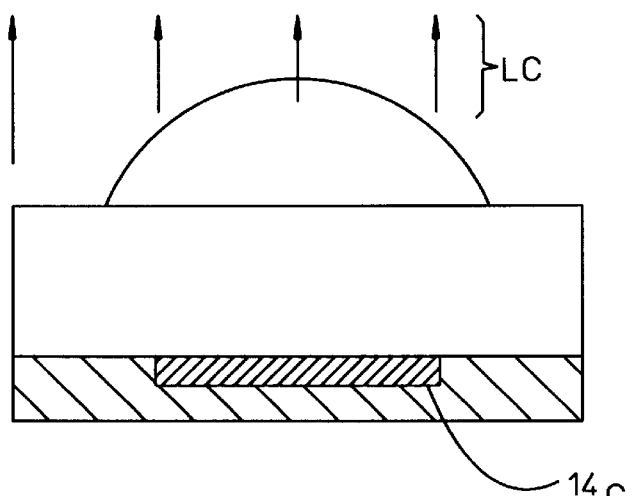
FIG. 2B illustrates emissive beam collimation.

Throughout the Figures, similar features are numbered consistently. As can be seen by referring to FIG. 2, the assembly as taught in the invention provides a substrate 12 containing optoelectronic elements 14, including but not limited to receptive element, emissive elements, or both. A light transmissive layer member 16 or spacer member of transmissive polymer or dielectric material, such choice of material including glass, covers the substrate 12 and optoelectronic elements 14 therein. A contoured surface 10 is provided by or upon the intermediate layer 16. In this embodiment, the contoured surface defines a ridged pattern exhibiting raised portions 19 and depressed portions 20 of the contoured surface. Convex-surfaced members of photosensitive material 18, such photosensitive material including but not limited to polymers and photoresistive elements, are arranged upon the contoured surface 10. A configuration of any plurality of such convex surfaced members 18 may be termed a microlens array. Hereinafter, the term microlens element(s) 18 or microlens array will be used, but it is to be understood that the intended meaning is any convex surfaced light transmissive element. The microlens elements 18 are closely spaced, one to another, but are not in contact with each other, the distance 20 between the microlens elements 18 depending on the design of the microlens array. Each microlens is optically associated with one optoelectronic element 14 in the substrate 12. The thickness of the light transmissive intermediate layer member 16 is predetermined so as to position the spot-size S of the transmitted light at a point such that the transmitted light impinges upon the optoelectronic element $14_o$ and the spot size diameter $d_s$ of the transmitted light is less than the diameter of the photosensitive element $d_p$, as depicted in FIG. 2. Where the optoelectronic elements are emissive $14_e$ in a device according to the invention, the device provides emission of collimated beams $L_c$ as illustrated in FIG. 2B.

Figure 3:
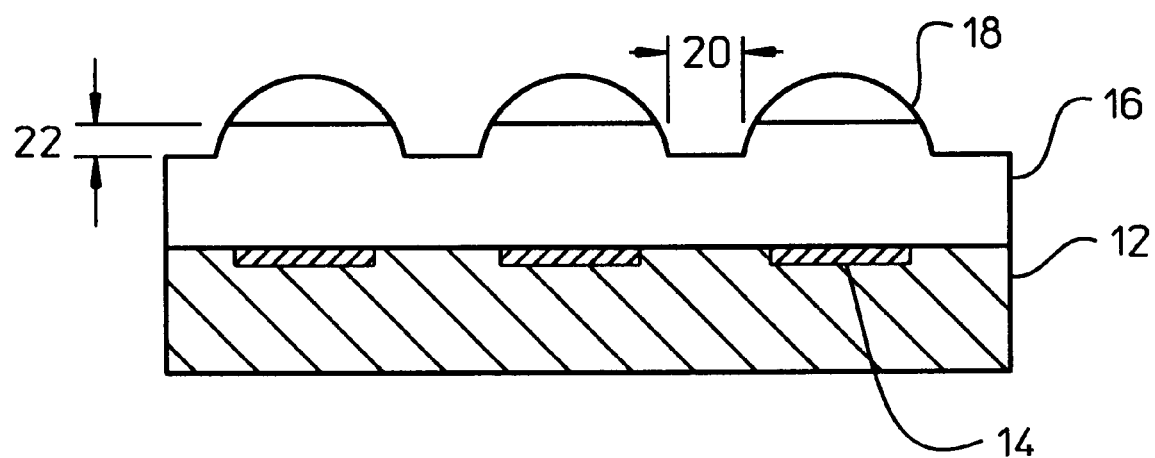
FIG. 3 illustrates a cross section of an assembly in accordance with another embodiment of the invention.

FIG. 3 illustrates an embodiment of the invention wherein the light transmissive layer member 16 has a contoured surface 10 that provides lateral spacing guides to the microlens elements 18. The contoured surface 10 has ridge elements 19; each ridge 19 is associated with one optoelectronic element 14. The ridge 19 operates to prevent contact of microlens elements 18 peripheries or other merging of the discrete lens elements in the array.

The ridge elements 19 are offset from each other by a predetermined distance 20.

Figure 4:
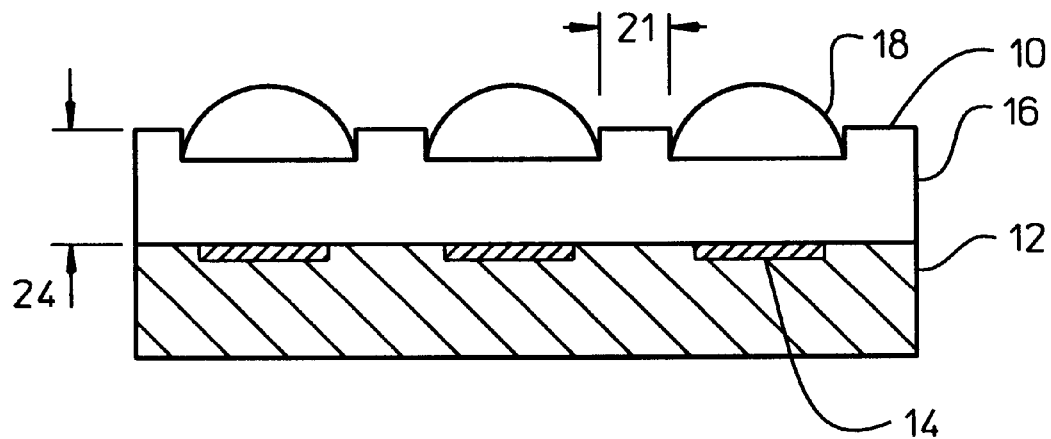
FIG. 4 illustrates a cross section of an assembly in accordance with another embodiment of the invention.
Figure 5:
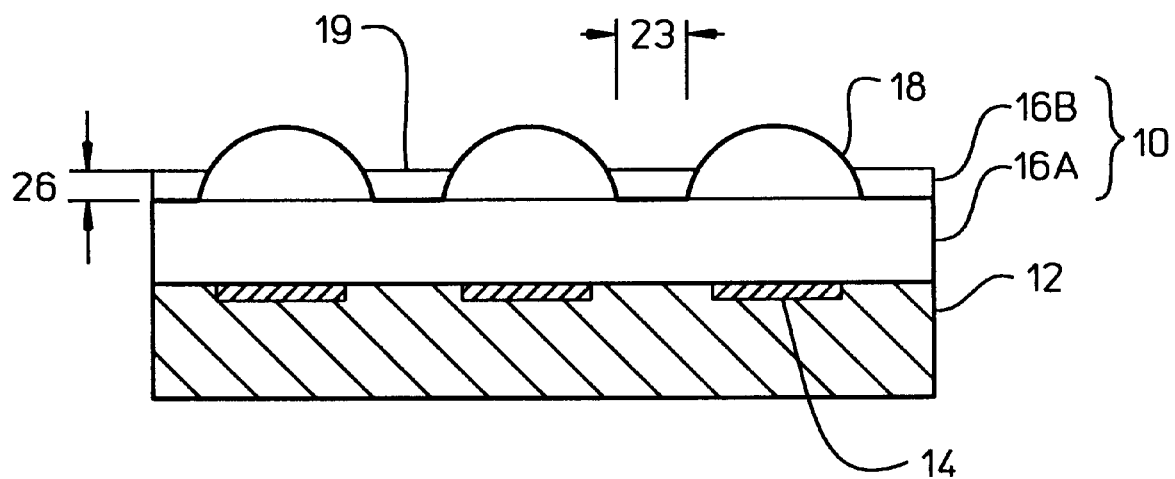
FIG. 5 illustrates a cross section of an assembly in accordance with another embodiment of the invention.

FIGS. 4 and 5 illustrate alternate configurations of the contoured surface 10. FIG. 4 illustrates the embodiment wherein the contoured surface provides ridge elements 19 between the microlens elements 18. FIG. 5 illustrates an embodiment wherein the contoured surface 10 is composed of a combination of at least two layers 16A,16B. The contoured surface 10 may exhibit ridge elements 19 of the same material as the light transmissive layer 16A, or ridge elements 19 may include another material, provided that the material(s) comprising the ridge element 19 are similarly etchable or otherwise capable of receiving a patterned topography. Dielectric transmissive materials and polymers are suitable for the additional layer 16B of the contoured surface 10.

Figure 6:
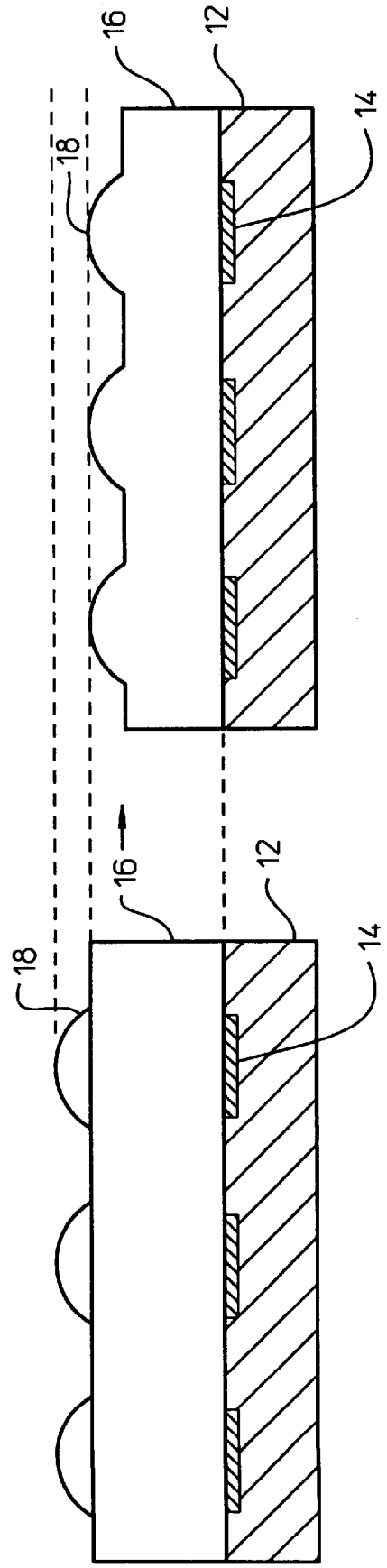
FIG. 6 illustrates a cross section of an assembly in accordance with another embodiment of the invention.

FIG. 6 illustrates an optoelectronic device in which the microlens array element 18 transfers, by means of dry etching or ion milling, its convex surface topography to the underlying spacer element, and results in the formation of a microlens 17 in the light transmissive layer element 16 itself. The method associated with this embodiment is set forth below relating to FIG. 7.

Figure 7A:
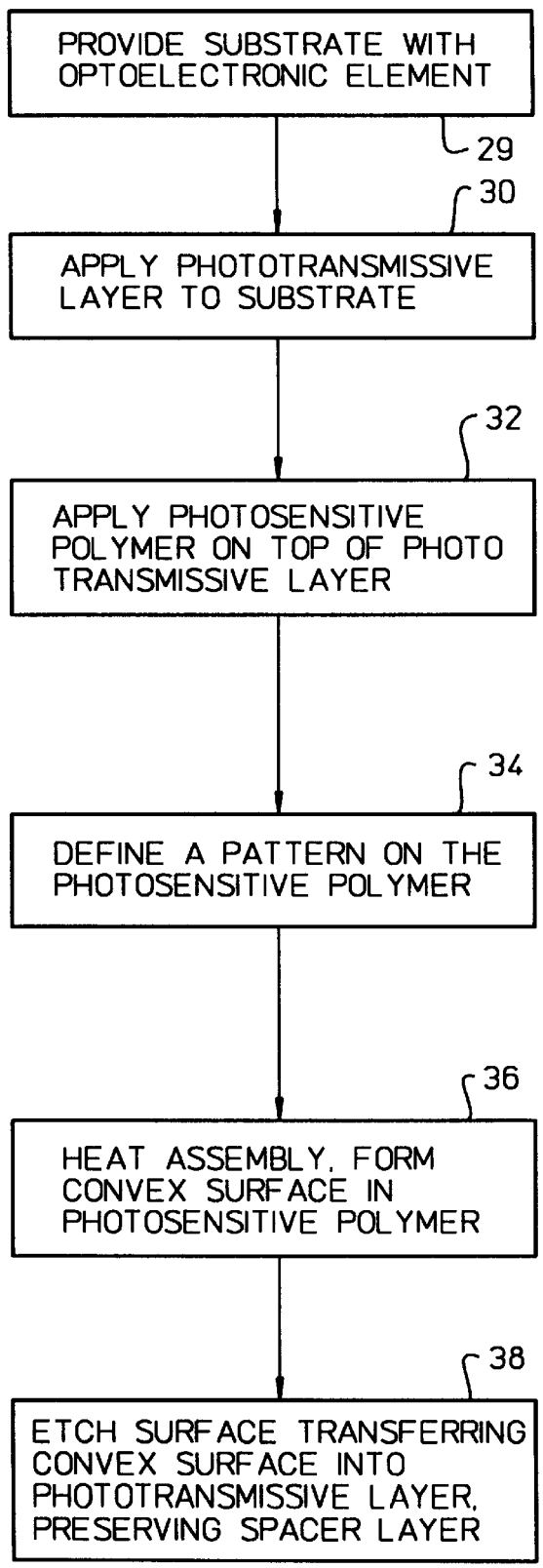
FIGS. 7A and 7B inclusive, illustrates a version of the inventive method.
Figure 7B:
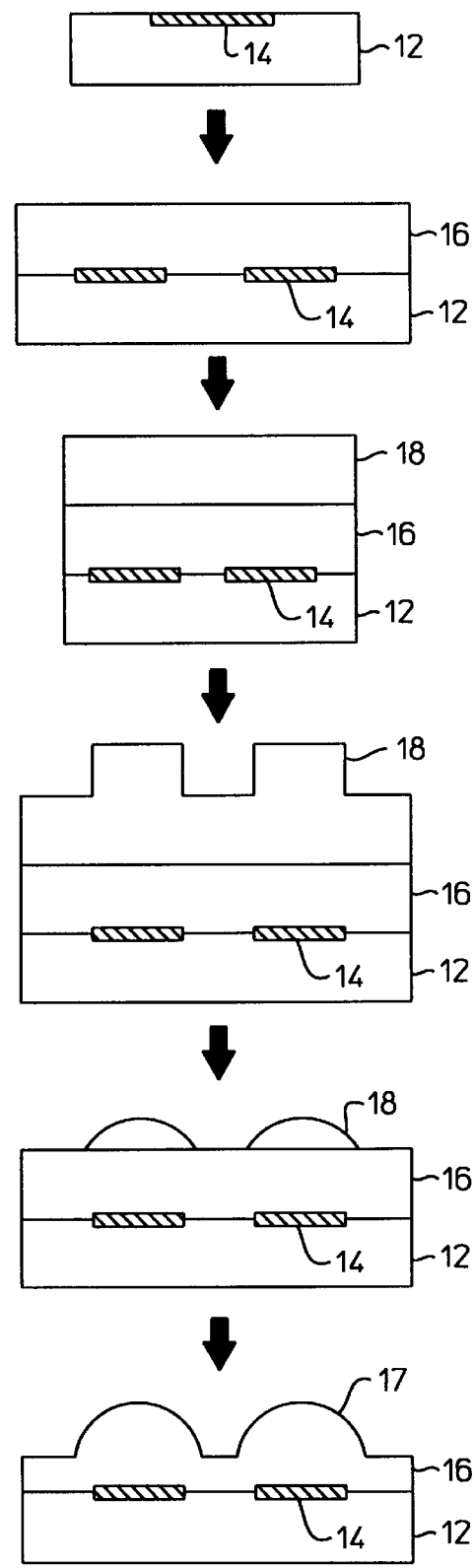

Referring now to FIG. 7, the selected substrate 12 containing an optoelectronic element 14 is layered 30 with optically transmissive material 16. A photosensitive polymer layer 18 is applied 32 on top of the optically transmissive layer 16. A pattern is defined 34 on the photosensitive polymer 18. Heating the assembly 36 melts the patterned photosensitive layer into convex surfaces. Etching 38 the convex patterned surface transfers the convex surface pattern into the photo transmissive layer forming lens elements 17 therein, and the lens elements are spaced from the optoelectronic elements such that the amount of light falling on the optoelectronic element is optimized.

Figure 9A:
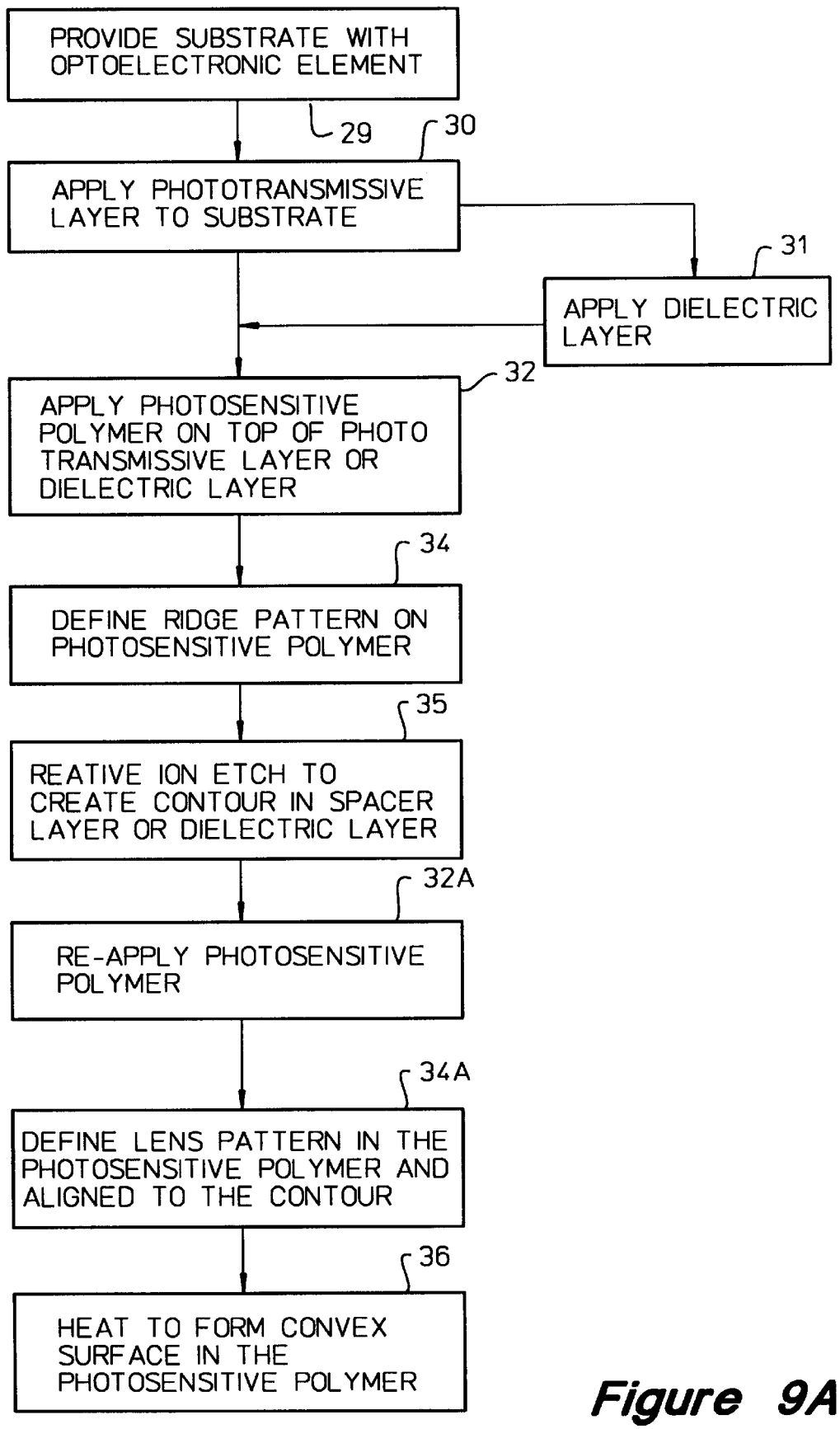
FIG. 9, inclusive, illustrates a version of the inventive method.
Figure 9B:
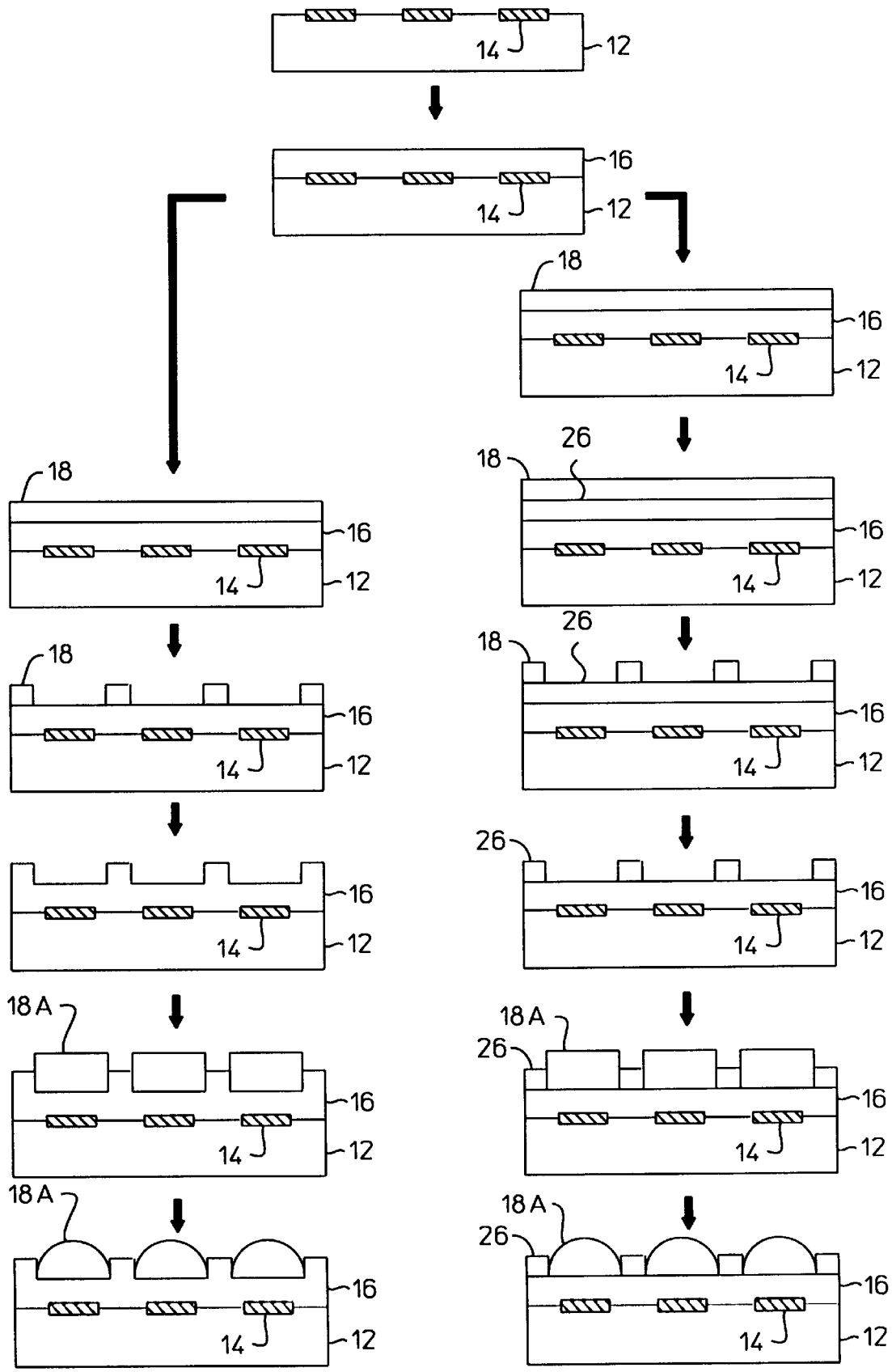

The inventive method is illustrated in FIG. 8 inclusive, and alternatively illustrated in FIG. 7 and FIG. 9. The method includes selection 29 of a substrate 12 which supports optoelectronic elements 14. After the substrate has been selected, a layer of predetermined thickness of transmissive material is applied 30 to the substrate 12. The transmissive material may be a polymer or a dielectric, including silicon based materials such as glass. In cases where the transmissive material is polyimide, the transmissive material may be applied 30 to the substrate by spin coating at 2000 rpm for 60 seconds, curing the polyimide, and repeating the spin coating and curing until the desired thickness is achieved. Spin speeds and cure times will vary depending on the material selected and the layer thickness desired, and may be determined by reference to available spin coating protocols.

After the transmissive intermediate layer has been applied, a photosensitive polymer 18 is applied 32 upon the transmissive intermediate layer 16. Examples of suitable photosensitive polymer materials include AZ P4620 and, for thin lenses, AZP4400. Application can be accomplished by spinning at 1500 rpm for 60 seconds followed by baking for a short time and repeating of spinning application until the desired thickness is achieved.

The photosensitive polymer 18 is then subjected to steps such that a pattern is imparted to the photosensitive polymer. Use of a photomask containing the desired microlens array pattern may impart the pattern by means of exposing the wafer assembly to UV light and developing the photosensitive polymer. In the embodiment shown in FIG. 8, after the photosensitive polymer has been developed, the surface of the assembly is reactive ion etched 35 to define a contoured surface 10 by removing some portion of the intermediate layer of transmissive material 16 from between the pattern of photosensitive polymer. Then, such heat is applied that the photosensitive polymer forms convex surfaced elements. Melting or reflowing the photosensitive polymer in this device is practical so long as the material selected for the light transmissive layer 16 element has a melting temperature greater than that of the photosensitive polymer.

Figure 2C:
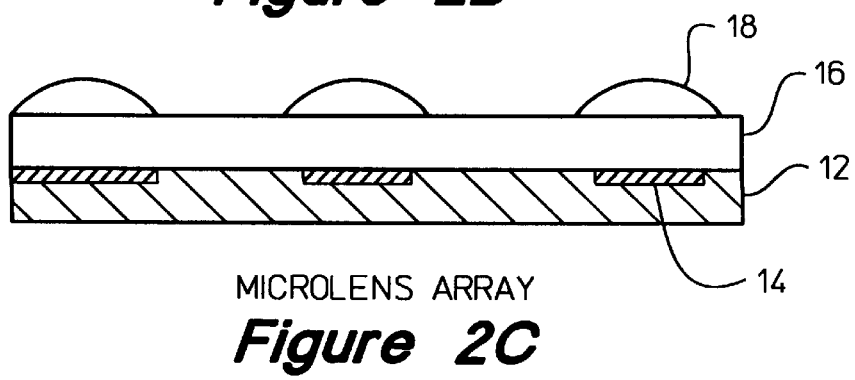
FIG. 2C shows microlens plurality.

In an alternate embodiment (not shown in 8B) after the development of the photosensitive polymer no etching is performed; the resulting device appears similar to that depicted in FIG. 2C.

In an alternative embodiment of the method (device therefrom depicted in FIG. 4 and method shown in FIG. 9) after the photosensitive polymer has been applied, the assembly is aligned with and exposed to a ridge pattern; the photosensitive polymer coated surface of the assembly is then reactive ion etched 35 to a depth sufficient to create a contoured surface in the spacer layer. Photosensitive polymer is then reapplied 32A and the lens pattern is defined 34A. Heating 36 forms convex surface elements in the photosensitive polymer In an alternative embodiment (see FIG. 5) a dielectric material (typically $SiO_2$ or $Si_3N_4$) is deposited 31 on the transmissive layer and photosensitive polymer is layered 18 on top of the dielectric material layer, FIG. 9A. A contoured surface 10 is then defined 33 in the dielectric material by photolithographic methods 34 and etching 35. Photosensitive polymer 18A is then reapplied 32A. A pattern is defined 34A in the photosensitive polymer. The entire assembly is heated 36 such that the photosensitive polymer forms convex surfaced elements 18A.

In each of the method embodiments set forth, the resulting device is characterized by the accommodation of the focal distance of the lens element in association with the optoelectronic element such that the amount of light falling on the optoelectronic element is optimized. Each of the embodiments are further characterized by the alignment of each microlens element with an optoelectronic element to the fill factor that the design may require and, if desired, to maximum fill factor.

These embodiments are illustrative of the invention only and are not exhaustive of embodiments of the inventive method and device taught herein.

We claim:

1. An optoelectronic device comprising:

a plurality of microlens members capable of receiving light;

a plurality of optoelectronic elements, each one of said elements associated with a respective one of said microlens members;

a light transmissive spacer layer member intermediate to said microlens members and said optoelectronic elements, said layer member of a thickness so that light is focused on the optoelectronic elements, said light transmissive spacer layer member further comprising a contoured surface, said contoured surface providing a ridged pattern of lateral spacing guides such that said microlens members are not in direct contact with each other.

2. A device as in claim 1 wherein the optoelectronic elements are photoemissive and wherein light emitted from said optoelectronic elements passes through the light transmissive layer member and the microlens members and exits in a collimated beam.

3. An optoelectronic arrangement comprising:

a substrate;

a plurality of optoelectronic elements supported by said substrate;

a convex surface member optically associated with a respective one of said optoelectronic elements;

a light transmissive spacer element intermediate to said convex surface member and said optoelectronic elements supported by said substrate, said light transmissive spacer element having a contoured surface upon which the convex surface member resides, said contoured surface including a ridged pattern of lateral spacing guides wherein said convex surface members are not in direct contact with each other, and said light transmissive spacer element positioning said optoelectronic elements and said convex surface member wherein the spot size diameter of transmitted light is less than the diameter of the optoelectronic elements.

4. A device as in claim 3 wherein the optoelectronics elements and the convex surface members are optically receptive and in which the substrate supports both optically receptive and transmissive elements.

5. A layer adapted for use as an intermediate layer in an optoelectronic device, said optoelectronic device including a plurality of microlens elements for collecting or focusing light and associated respective arrayed photoreceptive elements for receiving said light, said layer comprising:

light transmissive material having a predetermined thickness and contoured surface wherein the light transmitted by the microlens elements is focused upon the photoreceptive elements, said contoured surface including a ridged pattern of lateral spacing guides wherein said microlens elements are not in direct contact with each other.

6. A layer as in claim 5 adapted for use in an optoelectronic device, said optoelectronic device supporting one or more photoemittive elements, and one or more collimating microlens elements capable of collimating emitted light, wherein said light transmissive material having a predetermined thickness and surface topography wherein the light emitted by the photoemittive elements is optimally transmitted by the microlens elements.

7. A layer as in claims wherein the layer is further characterized by a contoured surface wherein the surface of the layer contributes to the spatial arrangement of said microlens elements thereby assisting optimization of collection and transmission of light.

8. A method of making an optoelectronic device, the method comprising:

a) providing a substrate supporting a plurality of optoelectronic elements;

b) applying a light transmissive layer to a first surface of the substrate containing the optoelectronic elements;

c) applying a photosensitive polymer to a surface of said light transmissive layer;

d) defining a predetermined pattern upon said photosensitive polymer creating thereby a pattern of said photosensitive polymer, said pattern being aligned with the optoelectronic elements;

e) heating the device to cause the photosensitive polymer to form convex surfaces and to a temperature below the melting point of the transmissive layer; and f) forming a contoured surface aligned with the optoelectronic elements wherein said contoured surface including a ridged pattern of lateral spacing guides wherein said convex surfaces are not in direct contact with each other.

9. The method as in claim 8 in which the step of forming a contoured surface includes:

(1) depositing additional contour material on the underlying light transmissive layer;

(2) forming a contoured surface in the additional layer.

10. The method of making an optoelectronic device as in claim 8, additionally comprising:

dry etching the convex surface of the polymer to a sufficient depth that the polymer has been substantially removed and the convex shape has been transferred to the underlying light transmissive layer.

* * * * *